(12) United States Patent
Park et al.

(10) Patent No.: US 12,218,286 B2
(45) Date of Patent: Feb. 4, 2025

(54) LIGHT EMITTING MODULE AND METHOD OF MANUFACTURING THE SAME AND DISPLAY APPARATUS HAVING THE SAME

(71) Applicant: Seoul Semiconductor Co., Ltd., Ansan-si (KR)

(72) Inventors: Jae Hyun Park, Ansan-si (KR); Seung Sik Hong, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 520 days.

(21) Appl. No.: 17/524,607

(22) Filed: Nov. 11, 2021

(65) Prior Publication Data

US 2022/0149246 A1    May 12, 2022

Related U.S. Application Data

(60) Provisional application No. 63/247,762, filed on Sep. 23, 2021, provisional application No. 63/112,778, filed on Nov. 12, 2020.

(51) Int. Cl.

| | |
|---|---|
| *H01L 33/48* | (2010.01) |
| *G02B 1/11* | (2015.01) |
| *H01L 25/075* | (2006.01) |
| *H01L 33/58* | (2010.01) |

(52) U.S. Cl.
CPC ........ *H01L 33/483* (2013.01); *H01L 25/0753* (2013.01); *H01L 33/58* (2013.01); *G02B 1/11* (2013.01); *H01L 2933/0058* (2013.01)

(58) Field of Classification Search
None
See application file for complete search history.

(56) References Cited

U.S. PATENT DOCUMENTS

| | | | |
|---|---|---|---|
| 2008/0278052 A1* | 11/2008 | Hwang | H01J 11/10 359/585 |
| 2011/0223696 A1 | 9/2011 | Basin et al. | |
| 2019/0244938 A1 | 8/2019 | Bang et al. | |
| 2020/0083397 A1 | 3/2020 | Lee et al. | |

FOREIGN PATENT DOCUMENTS

| | | | | |
|---|---|---|---|---|
| EP | 3640714 A1 * | 4/2020 | ....... | B29D 11/00009 |
| KR | 10-0779003 | 11/2007 | | |
| KR | 10-2014-0094818 | 7/2014 | | |
| KR | 10-2018-0067447 | 6/2018 | | |
| KR | 10-2019-0109222 | 9/2019 | | |
| KR | 10-2020-0029191 | 3/2020 | | |

OTHER PUBLICATIONS

International Search Report (PCT/ISA/210) issued for PCT/2021/016539 on Feb. 24, 2022.

* cited by examiner

*Primary Examiner* — Alexander G Ghyka
(74) *Attorney, Agent, or Firm* — Oblon, McClelland, Maier & Neustadt, L.L.P.

(57) ABSTRACT

A light emitting module including a circuit board, a plurality of unit pixels arranged on the circuit board, a molding member covering the unit pixels, and an anti-glare layer disposed on the molding member, in which the molding member includes a first molding layer at least partially covering each of the unit pixels, and a second molding layer covering the first molding layer.

11 Claims, 16 Drawing Sheets

LIGHT EMITTING MODULE AND METHOD OF MANUFACTURING THE SAME AND DISPLAY APPARATUS HAVING THE SAME

CROSS-REFERENCE TO RELATED APPLICATIONS

This application claims the benefit of United States Provisional Patent Application No. 63/112,778, filed on Nov. 12, 2020, and U.S. Provisional Patent Application No. 63/247,762, filed on Sep. 23, 2021, each of which is hereby incorporated by reference for all purposes as if fully set forth herein.

BACKGROUND

Field

Exemplary embodiments of the invention relate generally to a light emitting module, a method of manufacturing the same, and a display apparatus having the same, and more specifically, to a light emitting module including a molding member covering a plurality of unit pixels.

Discussion of the Background

A light emitting device may include a semiconductor device using an inorganic light source, such as a light emitting diode. Such light emitting device is used in various fields, such as a display apparatus, a vehicle lamp, and a general lighting. The light emitting diode has advantages over a conventional light source, such as longer lifespan, lower power consumption, and quicker response, and thus, the light emitting diode has been rapidly replacing the conventional light source.

In general, light emitting diodes have been typically used as backlight light sources in display apparatuses. However, display apparatuses that directly realize images using the light emitting diodes have been recently developed, and such displays are often referred to as micro LED displays.

A conventional display apparatus displays various colors through mixture of blue, green, and red light. In this case, in order to realize various images, the display apparatus includes a plurality of pixels, each including sub-pixels corresponding to one of blue, green, and red light. As such, a color of a certain pixel is typically determined based on the colors of the sub-pixels, so that images can be realized through the combination of such pixels.

In a micro LED display, a micro LED is arranged on a plane corresponding to each sub-pixel, and a large number of micro LEDs are mounted on one substrate. Since the micro LEDs are extremely small, which may range from 200 μm or less, and in some applications 100 μm or less, it is difficult to transfer the micro LEDs to a circuit board. In addition, it is also difficult to physically protect the light emitting diode without optical distortion or loss of luminance after the small-sized light emitting diode is mounted on the circuit board. Furthermore, the light emitting diode may need to be protected while improving an image quality of the display apparatus.

The above information disclosed in this Background section is only for understanding of the background of the inventive concepts, and, therefore, it may contain information that does not constitute prior art.

SUMMARY

Devices constructed according to exemplary embodiments of the invention, and a method of manufacturing the same, are capable of providing a light emitting module with an improved structure to alleviate a color tone change and suppress loss of luminance loss from a circuit board.

According to one or more embodiments of the invention, a light emitting module may have enhanced durability, and a method of manufacturing the same.

Additional features of the inventive concepts will be set forth in the description which follows, and in part will be apparent from the description, or may be learned by practice of the inventive concepts.

According to an exemplary embodiment, a light emitting module includes a circuit board, a plurality of unit pixels arranged on the circuit board, a molding member covering the unit pixels, and an anti-glare layer disposed on the molding member, in which the molding member includes a first molding layer at least partially covering each of the unit pixels, and a second molding layer covering the first molding layer.

The first molding layer may include a black molding layer, and the second molding layer may include a transparent molding layer.

The first molding layer may cover a side surface and an upper surface of each of the unit pixels, and the second molding layer may be disposed over the first molding layer.

The first molding layer may at least partially cover a side surface of the unit pixel, the second molding layer may cover the first molding layer, and the first molding layer may have a concave shape in a region between the unit pixels.

A portion of the second molding layer may be disposed between the unit pixels.

The first molding layer may cover upper surfaces of the unit pixels, and the first molding layer located on the unit pixels may have a convex shape.

An upper surface profile of the second molding layer may be substantially the same as a surface profile of the circuit board.

An upper surface of the circuit board may be non-planar, and each of the first molding layer and the second molding layer may have a flat upper surface.

The light emitting module may further include an anti-reflection layer disposed between the molding member and the anti-glare layer.

The light emitting module may further include a hardness enhancement layer disposed between the molding member and the anti-glare layer.

According to another exemplary embodiment, a method of manufacturing a light emitting module includes mounting a plurality of unit pixels on a circuit board, forming a molding member covering the unit pixels on the circuit board, and forming an anti-glare layer on the molding member, in which the molding member includes a first molding layer at least partially covering each of the unit pixels, and a second molding layer covering the first molding layer.

The method may further include cutting edges of the anti-glare layer, the molding member, and the circuit board.

The step of forming the molding member may include forming a pre-cured first molding layer by applying a first molding solution and pre-curing the first molding solution, applying pressure to the pre-cured first molding layer by placing a first plate on the pre-cured first molding layer, removing the first plate from the pre-cured first molding layer, forming a pre-cured second molding layer by applying a second molding solution on the pre-cured first molding layer and pre-curing the second molding solution, applying pressure to the pre-cured second molding layer by placing a second plate on the pre-cured second molding layer, and curing the first molding layer and the second molding layer with ultraviolet rays.

The step of applying the first molding solution may include applying a greater amount of the first molding solution to a central portion of the circuit board than second portions of the circuit board extending from the center portion and adjacent to corners of the circuit board.

Ends of the second portions may be spaced apart from the corners of the circuit board, respectively.

The step of forming the molding member may include forming the first molding layer by spraying a first molding solution on the circuit board using an inkjet technology, and forming the second molding layer by spraying a second molding solution on the first molding layer.

The first molding layer may include a black molding layer, and the second molding layer may include a transparent molding layer.

The method may further include forming an anti-reflection layer on the molding member before forming the anti-glare layer.

The method may further include forming a hardness enhancement layer before forming the anti-glare layer.

According to still another exemplary embodiment, a display apparatus includes a panel substrate, a plurality of light emitting modules arranged on the panel substrate, each of the light emitting modules including a circuit board, a plurality of unit pixels arranged on the circuit board, a molding member covering the unit pixels, and an anti-glare layer disposed on the molding member, in which the molding member includes a first molding layer at least partially covering each of the unit pixels, and a second molding layer covering the first molding layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
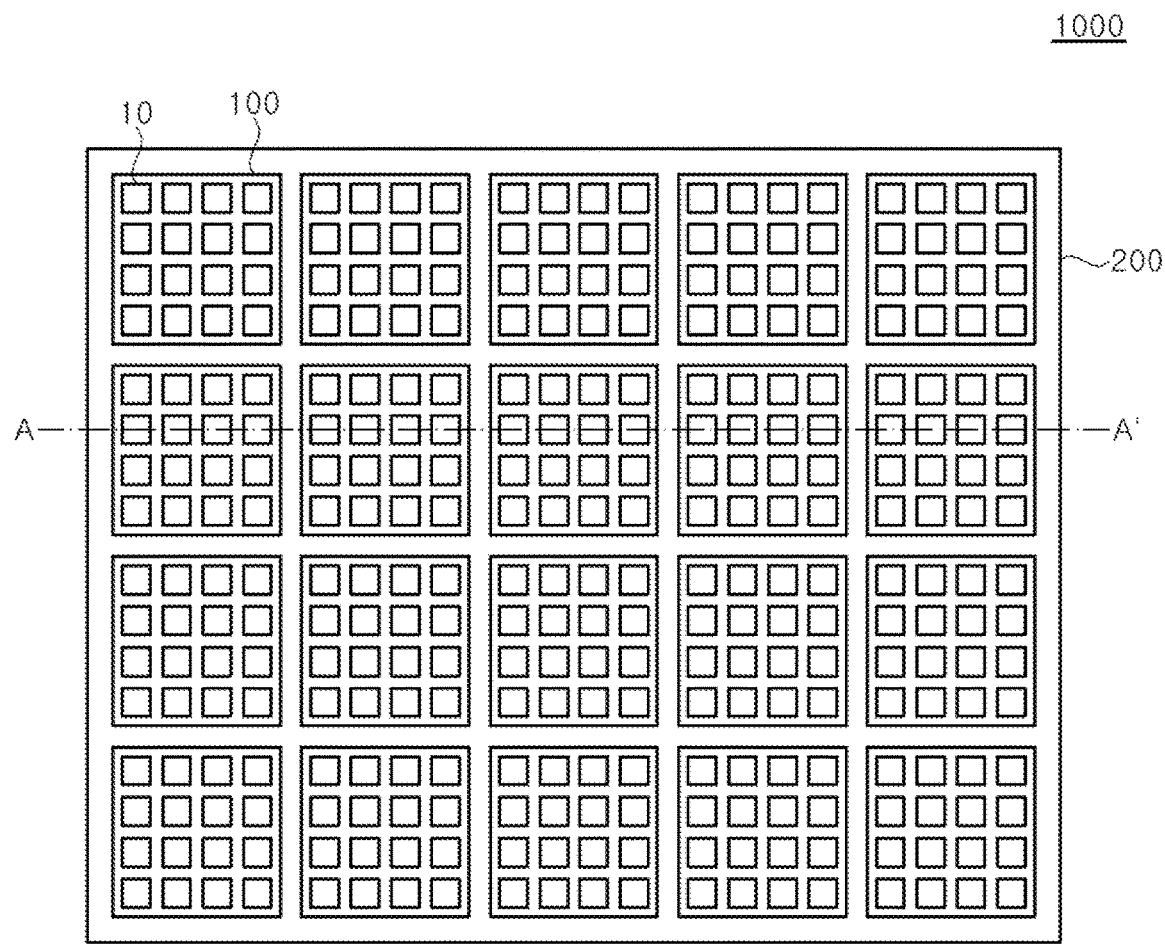
FIG. 1A is a schematic plan view illustrating a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
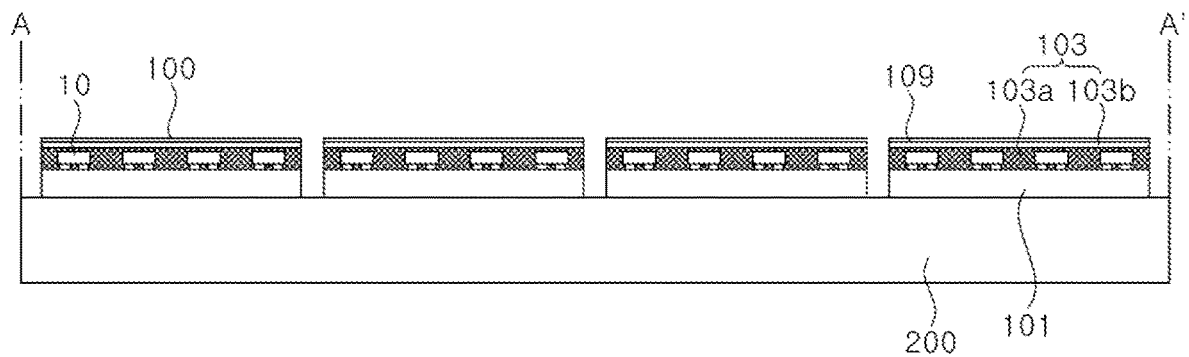
FIG. 1B is a schematic cross-sectional view taken along line A-A' of FIG. 1A.

FIG. 1A is a schematic plan view illustrating a display apparatus according to an exemplary embodiment, and FIG. 1B is a schematic cross-sectional view taken along line A-A' of FIG. 1A.

Referring to FIGS. 1A and 1B, a display apparatus 1000 may include a panel substrate 200 and a plurality of light emitting modules 100. Each of the light emitting modules 100 may include a plurality of unit pixels 10.

The display apparatus 1000 is not particularly limited to, but may include a VR display apparatus such as a micro LED TV, a smart watch, a VR headset, or an AR display apparatus such as augmented reality glasses.

The panel substrate 200 may be formed of a material, such as polyimide (PI), FR4, glass, or the like, and may include a circuit for passive matrix driving or active matrix driving. In an exemplary embodiment, wirings and resistors may be included in the panel substrate 200. In another exemplary embodiment, the panel substrate 200 may include wirings, transistors, capacitors, and the like. In addition, the panel substrate 200 may have pads on an upper surface thereof for electrical connection to the circuit.

The light emitting modules 100 may be arranged on the panel substrate 200. The light emitting modules 100 may be arranged to be spaced apart from one another, or to be in close contact with one another. An interval between the light emitting modules 100 may be set in consideration of an interval between the unit pixels 10, which will be described in detail later. For example, an interval between two adjacent unit pixels 10 respectively disposed in adjacent light emitting modules 100 may be substantially the same as an interval between the unit pixels 10 in one light emitting module 100. However, the inventive concepts are not necessarily limited thereto. According to an exemplary embodiment, the light emitting module 100 may include a circuit board 101, a plurality of unit pixels 10, a molding member 103, and an anti-glare layer 109, which will be described in detail with reference to FIGS. 2A and 2B.

Figure 2A:
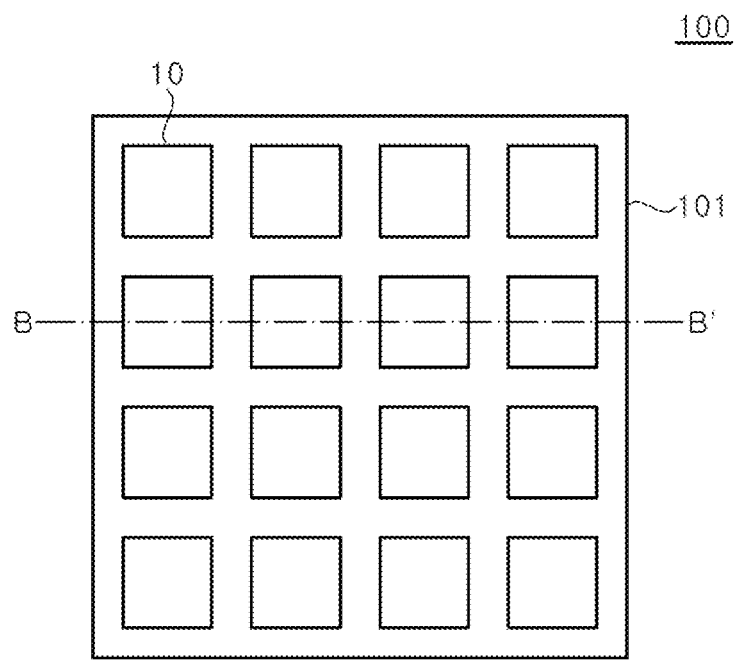
FIG. 2A is a schematic plan view illustrating a light emitting module according to an exemplary embodiment.
Figure 2B:
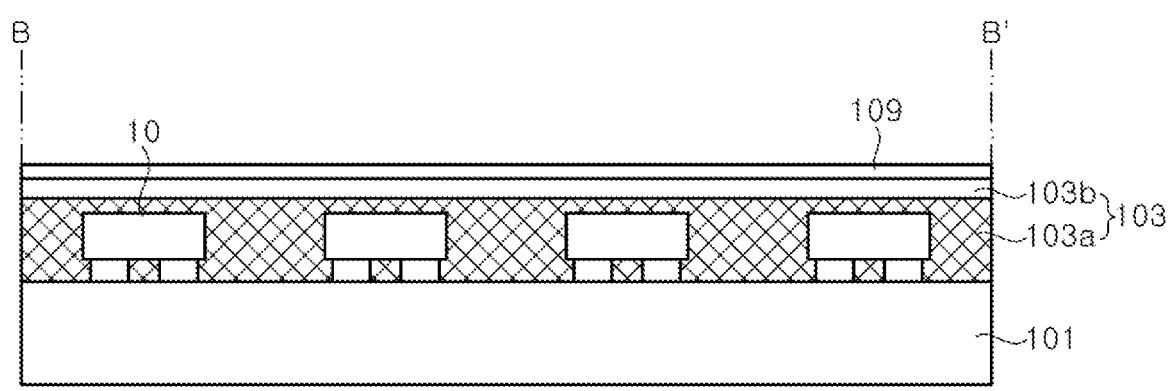
FIG. 2B is a schematic cross-sectional view taken along line B-B' of FIG. 2A.

FIG. 2A is a plan view illustrating the light emitting module 100 according to an exemplary embodiment, and FIG. 2B is a schematic cross-sectional view taken along line B-B' of FIG. 2A.

Referring to FIGS. 2A and 2B, the light emitting module 100 according to an exemplary embodiment may include a circuit board 101, a plurality of unit pixels 10, a molding member 103, and an anti-glare layer 109. The molding member 103 may include a first molding layer 103a and a second molding layer 103b.

The circuit board 101 may have a circuit for electrically connecting the panel substrate 200 and the plurality of unit pixels 10. A circuit in the circuit board 101 may have a multi-layered structure. The circuit board 101 may also include a passive circuit for driving the unit pixels 10 in a passive matrix driving manner, or an active circuit for driving the unit pixels 10 in an active matrix driving manner. The circuit board 101 may have pads exposed on a surface thereof, and the plurality of unit pixels 10 may be bonded to the pads of the circuit board 101 through a bonding material. In some exemplary embodiments, the circuit board 101 may be formed as a black circuit board suitable for a display apparatus.

Figure 13A:
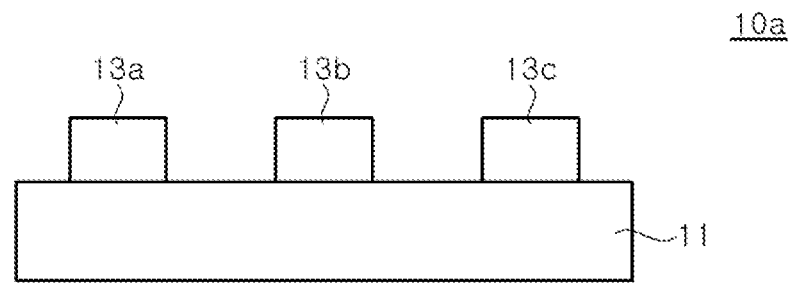
FIGS. 13A, 13B, and 13C are schematic cross-sectional views illustrating a unit pixel according to exemplary embodiments.
Figure 13B:
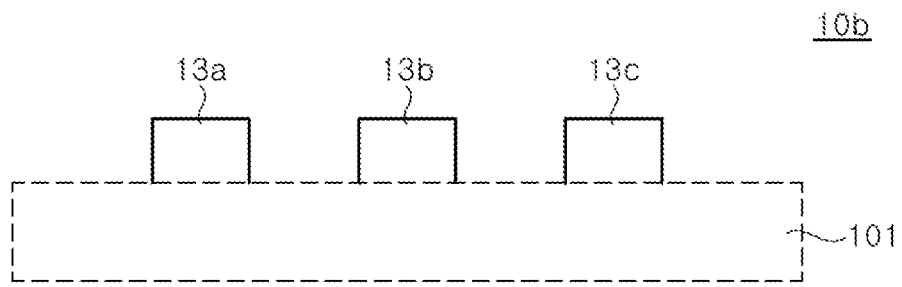

The plurality of unit pixels 10 is arranged on the circuit board 101. The plurality of unit pixels 10 may include a plurality of light emitting devices emitting red light, green light, and blue light, respectively. The light emitting devices may correspond to a sub-pixel, respectively. In an exemplary embodiment, the unit pixel 10 may include at least three light emitting devices arranged on a same plane. For example, as shown in FIG. 13A, a unit pixel 10a may include at least three light emitting devices 13a, 13b, and 13c spaced apart from one another on a transparent substrate 11, and the light emitting devices 13a, 13b, and 13c may be disposed on the circuit board 101 together with the transparent substrate 11 to emit light through the transparent substrate 11. As another example, as shown in FIG. 13B, the plurality of unit pixels 10b may include at least three light emitting devices 13a, 13b, and 13c spaced apart from one another, respectively. A unit pixel 10c may include the light emitting devices 13a, 13b, and 13c arranged on the circuit board 101 without the transparent substrate 11 shown in FIG. 13A. In this manner, at least three light emitting devices 13a, 13b, and 13c disposed adjacent to one another on the circuit board 101 may define one unit pixel 10.

Figure 13C:
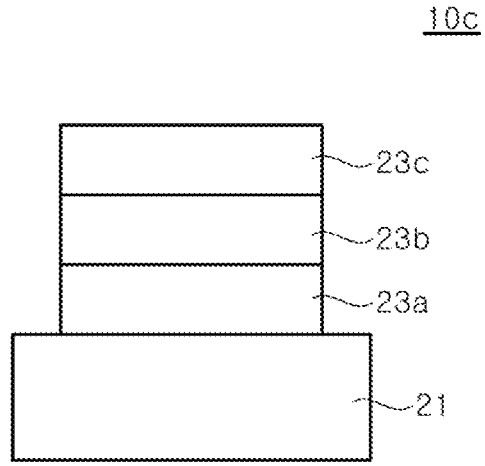

In another exemplary embodiment, the plurality of unit pixels 10c may include a first LED stack 23a, a second LED stack 23b, and a third LED stack 23c stacked in a vertical direction, respectively. The first LED stack 23a, the second LED stack 23b, and the third LED stack 23c may form a sub-pixel, respectively. As shown in FIG. 13C, the unit pixel 10c may include first, second, and third LED stacks 23a, 23b, and 23c disposed on a transparent substrate 21 in a vertical direction. The first, second, and third LED stacks 23a, 23b, and 23c may be disposed on the circuit board 101 together with the transparent substrate 21 to emit light through the transparent substrate 21.

The plurality of unit pixels 10 may be arranged in a matrix form on the circuit board 101. The plurality of unit pixels 10 may be arranged in 4×4 as shown in FIG. 2A, but is the inventive concepts are not limited thereto. In some exemplary embodiments, the plurality of unit pixels 10 may be arranged in various matrices, such as 2×2, 3×3, 5×5, or the like (e.g., n×m, in which n and m are positive integers).

The molding member 103 may include a plurality of molding layers 103a and 104b, and the number of the plurality of molding layers 103a and 104b is not particularly limited. The plurality of molding layers 103a and 104b may have different colors from one another, and may be made of at least two types of materials.

The first molding layer 103a may be disposed on the circuit board 101 so as to cover the plurality of unit pixels 10. More particularly, the first molding layer 103a may be in contact with a surface of the circuit board 101, and may cover lower surfaces, side surfaces, and upper surfaces of the plurality of unit pixels 10. The first molding layer 103a may have a flat upper surface. For example, even when the circuit board 101 may be bent or distorted, such that a surface thereof may not be flat, the first molding layer 103a may provide a flat upper surface without being affected by the flatness of the circuit board 101. In particular, the first molding layer 103a may planarize or mitigate distortion in the upper surface of the circuit board 101 to provide the flat upper surface. Accordingly, the first molding layer 103a may partially include a thick portion and a thin portion, and an upper surface profile of the first molding layer 103a may be different from that of the circuit board 101.

The second molding layer 103b may cover the upper surface of the first molding layer 103a, and may have a flat upper surface. The second molding layer 103b may have a substantially uniform thickness. Side surfaces of the first molding layer 103a and the second molding layer 103a may be flush with one another, and the side surfaces thereof may also be flush with a side surface of the substrate 101.

The molding member 103 including the first molding layer 103a and the second molding layer 103b may be formed using an ultraviolet-curable resin, for example, to increase the hardness of the molding member 103 as compared to using a thermosetting resin. However, the inventive concepts are not limited thereto, and in some exemplary embodiments, the thermosetting resin may be used to form the molding member 103.

The molding member 103 may include an acryl-based resin, a silicone-based resin, or a urethane-based resin. The molding material of the molding member 103 may further include a light absorber or a dye. The molding material of the molding member 103 may be transparent, or may be black, white, or gray.

In an exemplary embodiment, the first molding layer 103a may be formed as a black molding layer. The black molding layer may improve uniformity of extracted light by reducing a color tone change caused by the circuit board 101. In addition, since the first molding layer 103a covers the plurality of unit pixels 10, the first molding layer 103a may block light extracted from the side surface of the unit pixel 10, and thus, a left and right viewing angle may be reduced, and a boundary line between adjacent unit pixels may be prevented from being observed.

Meanwhile, the second molding layer 103b may be formed of a transparent molding layer. The transparent molding layer may improve a visual image by eliminating or at least suppressing optical distortion of the display apparatus 1000. In addition, by disposing the black molding layer and the transparent molding layer together, a luminance may be improved as compared to when only the black molding layer is disposed, as well as alleviating a color tone change due to the circuit board 101.

In the illustrated exemplary embodiment, the first molding layer 103a is exemplarily described as being formed as the black molding layer and that the second molding layer 103b is being formed as the transparent molding layer, but the inventive concepts are not limited thereto. In another exemplary embodiment, the first molding layer 103a may be formed as a transparent molding layer, and the second molding layer 103b may be formed as a black molding layer. By forming the second molding layer 103b as the black molding layer with a uniform thickness, the color tone change due to the circuit board 101 may be improved, and a luminance uniformity depending on a location in the light emitting module 100 may be improved.

In the illustrated exemplary embodiment, the first molding layer 103a may cover upper surfaces of the plurality of unit pixels 10. A thickness of the first molding layer 103a located on the upper surfaces of the unit pixels 10 may be less than a width between the unit pixels 10.

The anti-glare layer 109 may be disposed on the molding member 103. The anti-glare layer 109 may prevent glaring by scattering light by mixing fine particles, such as silica, melamine, acryl, and the like, with a cured resin. The anti-glare layer 109 may maintain high transmittance, and improve clarity and smoothness of the surface of the light emitting module 100. The anti-glare layer 109 may include fine particles, such as silica, melamine, and acryl, along with polymers such as acryl, silicone, and urethane. An anti-glare effect may be controlled by controlling the thickness of the anti-glare layer 109, a density and a size of the fine particle, and the like.

In illustrated exemplary embodiment, each of the light emitting modules 100 includes the molding member 103. In addition to the molding member 103, an additional molding member covering the light emitting modules 100 may be disposed on the panel substrate 200. In this manner, boundary lines between the light emitting modules 100 may be prevented from being observed.

Figure 3A:
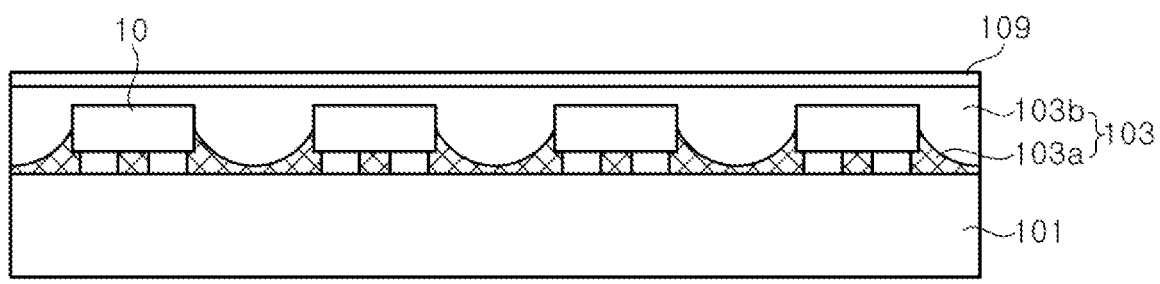
FIG. 3A is a schematic cross-sectional view illustrating a light emitting module according to another exemplary embodiment.

FIG. 3A is a schematic cross-sectional view illustrating a light emitting module according to another exemplary embodiment.

Referring to FIG. 3A, the light emitting module includes a circuit board 101, a plurality of unit pixels 10, a first molding layer 103a, a second molding layer 103b, and an anti-glare layer 109. The circuit board 101, the plurality of unit pixels 10, and the anti-glare layer 109 are similar to those described with reference to FIGS. 2A and 2B, and thus, repeated descriptions thereof will be omitted to avoid redundancy.

The first molding layer 103a according to the illustrated exemplary embodiment may be disposed to cover lower surface and side surfaces of the unit pixels 10. The first molding layer 103a exposes an upper surface of the unit pixels 10, and thus, a luminance of the unit pixels 10 may be increased. Meanwhile, the first molding layer 103a may have a concave surface between the unit pixels 10. The first molding layer 103a forms a sidewall in contact with the unit pixel 10. The first molding layer 103a located on the side surface of the unit pixel 10 forms a thicker sidewall toward a lower portion of the unit pixel 10. More particularly, a thickness of the first molding layer 103a in a lateral direction increases as it is closer to the unit pixel 10.

The second molding layer 103b may be disposed along a concave upper surface of the first molding layer 103a. The second molding layer 103b may be formed with a greater amount of materials than those forming the first molding layer 103a, and may have a flatter upper surface than that of the first molding layer 103a.

The first molding layer 103a may be formed as a black molding layer, and the second molding layer 103b may be formed as a transparent molding layer. Accordingly, the first molding layer 103a may not block light emitted sideward from an upper region of the unit pixel 10, but may block light emitted sideward from a lower region of the unit pixel 10. As such, a luminance and a viewing angle of light emitted from the unit pixels 10 may be increased while effectively preventing an occurrence of optical interference between the unit pixels 10.

However, the inventive concepts are not limited thereto, and in some exemplary embodiments, the first molding layer 103a may be formed as a transparent molding layer, and the second molding layer 103b may be formed as a black molding layer. Accordingly, most of light emitted to the sides of the unit pixels 10 may be blocked.

The first molding layer 103a and the second molding layer 103b may cover the side and upper surfaces of the unit pixel 10 in a same shape regardless of a location of the circuit board 101. For example, even when the unit pixels 10 are disposed at different elevations because the circuit board 101 is bent or distorted, the first molding layer 103a and the second molding layer 103b may substantially equally cover the side surface and the upper surface of each of the unit pixels 10. In particular, the first molding layer 103a and the second molding layer 103b may be formed along a non-planar surface of the circuit board 101, and thus, an upper surface of the second molding layer 103b may be formed in a same shape as an upper surface of the circuit board 101. In particular, an upper profile of the second molding layer 103b may be substantially the same as that of the circuit board 101.

Figure 3B:
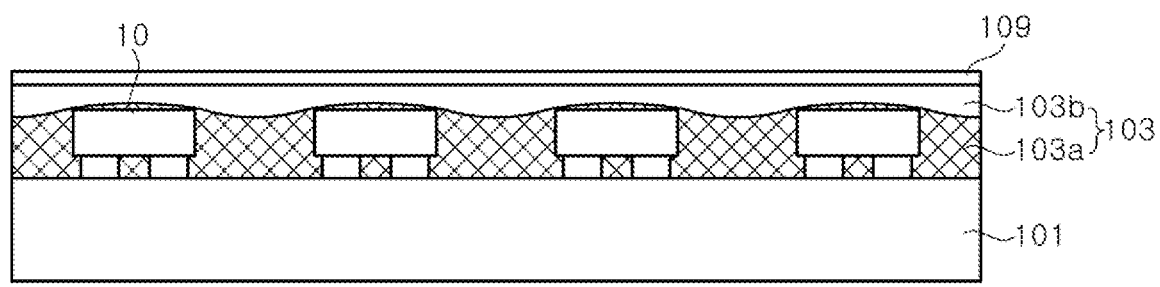
FIG. 3B is a schematic cross-sectional view illustrating a light emitting module according to another exemplary embodiment.

FIG. 3B is a schematic cross-sectional view illustrating a light emitting module according to another exemplary embodiment.

Referring to FIG. 3B, the light emitting module according to the illustrated exemplary embodiment is substantially similar to the light emitting module described with reference to FIG. 3A, except that a first molding layer 103a covers upper surfaces of unit pixels 10. In particular, the first molding layer 103a may cover the upper surfaces, side surfaces, and lower surfaces of the unit pixels 10. However, the first molding layer 103a may have a concave surface in a region between the unit pixels 10, and may have a convex surface on the unit pixels 10. A second molding layer 103b may cover the first molding layer 103a, and may have a flat upper surface compared to an upper surface of the first molding layer 103b.

In the illustrated exemplary embodiment, the first molding layer 103a and the second molding layer 103b may also be formed along a non-planar surface of a circuit board 101 as described with reference to FIG. 3A. Accordingly, substantially the same amount of the first molding layer 103a may be disposed on the unit pixels 10, and an upper surface of the second molding layer 103b may be formed to have substantially the same shape as an upper surface of the circuit board 101 along the non-planar surface of the circuit board 101.

Figure 4:
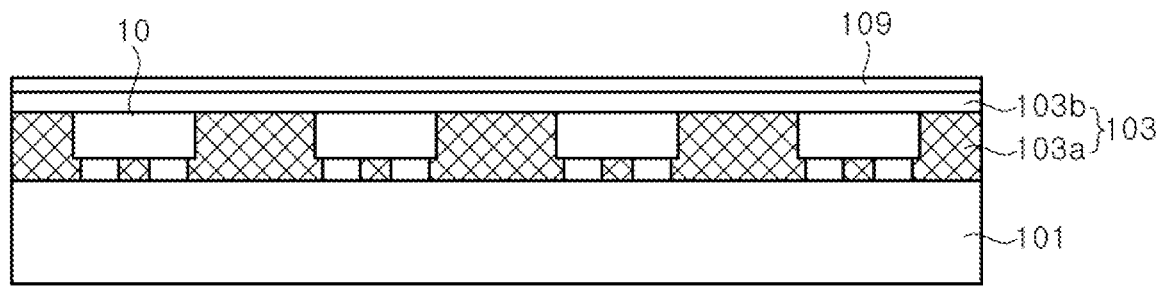
FIG. 4 is a schematic cross-sectional view illustrating a light emitting module according to another exemplary embodiment.

FIG. 4 is a schematic cross-sectional view illustrating a light emitting module according to another exemplary embodiment.

Referring to FIG. 4, the light emitting module according to the illustrated exemplary embodiment may include a circuit board 101, a plurality of unit pixels 10, a first molding layer 103a, a second molding layer 103b, and an anti-glare layer 109. Since the light emitting module according to the illustrated exemplary embodiment is substantially similar to the light emitting module described above with reference to FIGS. 2A and 2B, differences will be mainly described below so as to avoid redundancy.

In the illustrated exemplary embodiment, the first molding layer 103a may be disposed around lower surfaces and side surfaces of the unit pixels 10. The first molding layer 103a may be also be formed on the circuit board 101 and exposes upper surfaces of the plurality of unit pixels 10. The first molding layer 103a may have a flat upper surface, and the upper surface of the first molding layer 103a may be flush with the upper surface of the unit pixels 10. The second molding layer 103b may be disposed on the first molding layer 103a, and may be in contact with the upper surfaces of the unit pixels 10.

The first molding layer 103a may be formed as a black molding layer, and the second molding layer 103b may be formed as a transparent molding layer, but the inventive concepts are not limited thereto. In some exemplary embodiments, the first molding layer 103a may be formed as a transparent molding layer, and the second molding layer 103b may be formed as a black molding layer.

Figure 5:
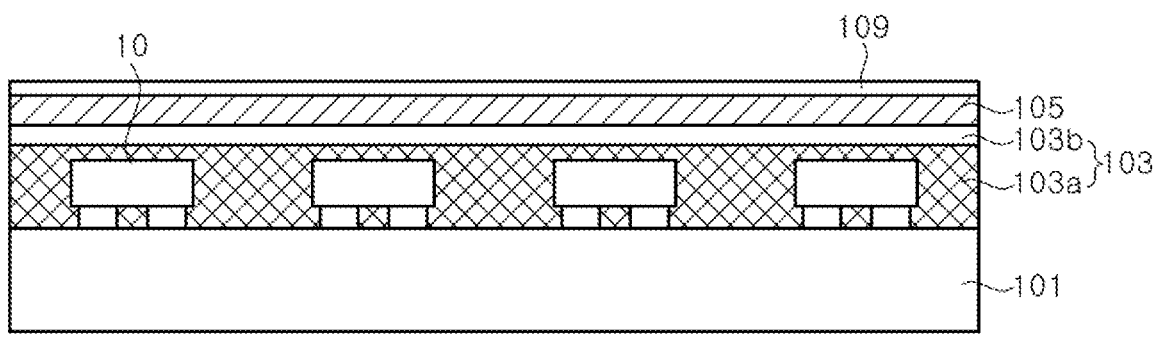
FIG. 5 is a schematic cross-sectional view illustrating a light emitting module according to another exemplary embodiment.

FIG. 5 is a schematic cross-sectional view illustrating a light emitting module according to another exemplary embodiment.

Referring to FIG. 5, the light emitting module according to the illustrated exemplary embodiment is substantially similar to the light emitting module described with reference to FIGS. 2A and 2B, except that it may further include an anti-reflection layer 105 between a second molding layer 103b and an anti-glare layer 109.

The anti-reflection layer 105 prevents light reflection occurring on an upper surface of the second molding layer 103b to improve luminance of the light emitting module. In an exemplary embodiment, the anti-reflection layer 105 may be disposed on the second molding layer 103b using an optical adhesive material. The optical adhesive material covers the second molding layer 103b to prevent reflection of light from a surface of the second molding layer 103b. The optical adhesive material may include, for example, acryl-based, silicone-based, urethane-based components, and the like. According to an exemplary embodiment, the adhesive may be an amorphous optically clear resin (OCR) in a liquid form on in a film form, such as a double-sided tape.

The anti-reflection layer 105 may be an anti-reflector (AR) coating film, in which a polymer material such as polyethylene terephthalate (PET) or tri-acetyl cellulose (TAC) is applied by a wet coating method. In another exemplary embodiment, the anti-reflection layer 105 may be formed by disposing inorganic material layers having different refractive indices. For example, at least two of oxide layers, such as indium tin oxide (ITO), $SiO_2$, SiON, $Si_3N_4$, $TiO_2$, and $Ta_2O_5$, are stacked on the second molding layer 103b to form the anti-reflection layer 105, or the anti-reflection layer 105 may be formed by attaching a coating film on which oxide layers are stacked on the second molding layer 103b. The anti-reflection layer 105 may utilize an interference of light occurring at an interface of thin films by stacking two or more thin films having different refractive indices. Wavelengths reflected from an interface of each thin film may cause destructive interference with one another, and thus, a reflectance of the anti-reflection layer 105 may be reduced and a transmittance may be increased, thereby increasing a luminance of the display apparatus.

Figure 6:
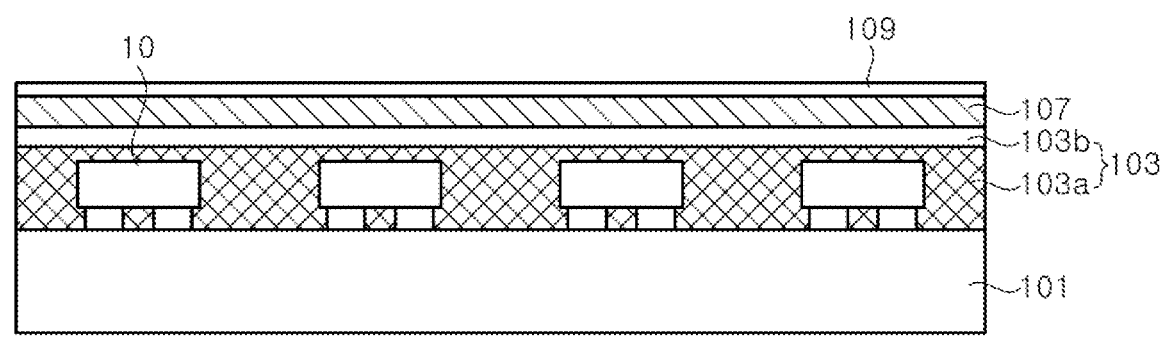
FIG. 6 is a schematic cross-sectional view illustrating a light emitting module according to another exemplary embodiment.

FIG. 6 is a schematic cross-sectional view illustrating a light emitting module according to another exemplary embodiment.

Referring to FIG. 6, the light emitting module according to the illustrated exemplary embodiment is substantially similar to the light emitting module described with reference to FIGS. 2A and 2B, except that it may further include a hardness enhancement layer 107 between a second molding layer 103b and an anti-glare layer 109.

The hardness enhancement layer 107 may be disposed on the second molding layer 103b. The hardness enhancement layer 107 may be disposed on the second molding layer 103b using an optical adhesive material.

The hardness enhancement layer 107 may include glass or plastic, and the plastic may include, for example, polymethyl methacrylate (PMMA), polycarbonate, and the like. The hardness enhancement layer 107 may have a pencil hardness of 2H or more. The light emitting module may further include an anti-reflection layer and an anti-pollution layer. The hardness enhancement layer 107 may be formed of an ultraviolet curing material. In this case, the hardness enhancement layer 107 may be cured by UV irradiation together with the first molding layer 103a and the second molding layer 103b.

In exemplary embodiments, a light emitting module 100 may include a plurality of unit pixels 10, and a plurality of light emitting modules 100 may be arranged to manufacture a display apparatus 1000. Hereinafter, a method of manufacturing the light emitting module will be described in detail.

FIGS. 7A through 7G are schematic cross-sectional views illustrating a method of manufacturing a light emitting module according to an exemplary embodiment.

Figure 7A:
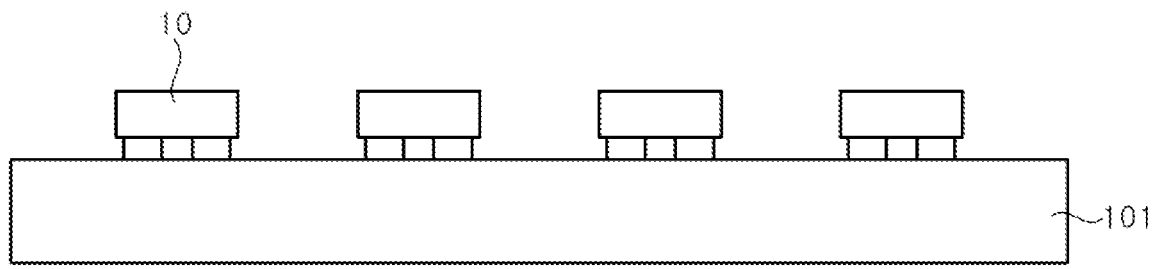
FIGS. 7A, 7B, 7C, 7D, 7E, 7F, and 7G are schematic cross-sectional views illustrating a method of manufacturing a light emitting module according to an exemplary embodiment.

Referring to FIG. 7A, a plurality of unit pixels 10 is bonded on a circuit board 101. The plurality of unit pixels 10 may be disposed on an upper surface of the circuit board 101 while being spaced apart from one another at regular intervals. Electrodes of the unit pixel 10 may be bonded to electrodes formed on the circuit board 101 through solder, respectively, but the inventive concepts are not limited thereto. In some exemplary embodiments, and electrodes of the unit pixel 10 and the circuit board 101 may be bonded by, for example, eutectic bonding, epoxy bonding, or the like.

Figure 7B:
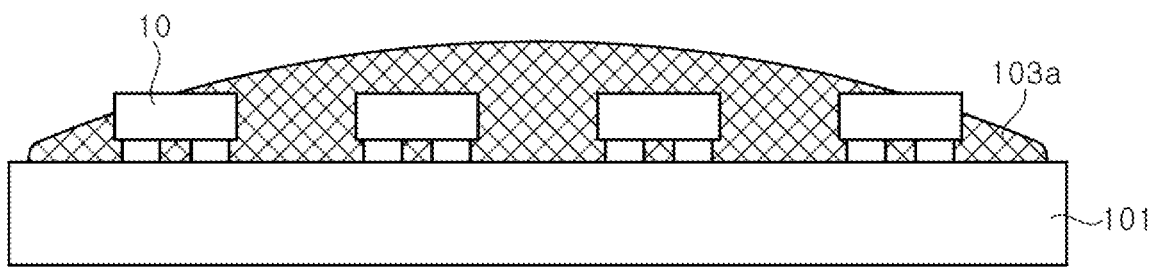

Referring to FIG. 7B, a first molding layer 103a may be formed by applying a molding solution on the circuit board 101. The molding solution may be applied, coated, or jetted on the circuit board 101, but the inventive concepts are not limited thereto. After the molding solution is applied, the molding solution may be pre-cured. In an exemplary embodiment, the first molding layer 103*a* may be formed by applying a molding solution including a black dye. In another exemplary embodiment, the first molding layer 103*a* may be formed by applying a transparent molding solution.

When the first molding layer 103*a* is formed by applying the molding solution, it is generally difficult to apply the molding solution to the circuit board 101 in a uniform thickness.

Figure 8:
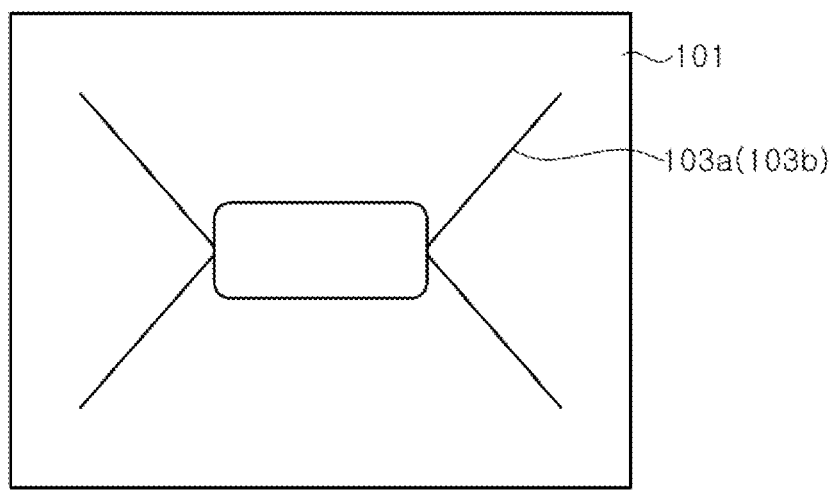
FIG. 8 is a schematic plan view illustrating a method of manufacturing a light emitting module according to an exemplary embodiment.

More particularly, when the molding solution is applied to an entire surface of the circuit board 101, the molding solution may be accumulated on an edge of the circuit board 101 so that the first molding layer 103*a* may be formed to be thick on the edge of the circuit board 101. According to the illustrated exemplary embodiment, in order to prevent the molding solution from being accumulated on an edge of the circuit board 101, the molding solution may be applied to a portion of the circuit board 101 rather than to the entire surface of the circuit board 101. In particular, a larger amount of the molding solution may be applied to a central portion, as compared to other portions of the circuit board 101, so that the central portion thereof may have a convex shape, as schematically shown in FIG. 8. Referring to FIG. 8, a greater amount of the molding solution forming the first molding layer 103*a* may be applied to the central portion of the circuit board 101, and may be applied in a branched shape toward corners of the circuit board 101 from the central portion. For example, a first portion of the molding solution may be applied to the central portion of the circuit board 101 and at least four branch portions may be applied toward the corners of the circuit board 101 from the central portion. An amount of the molding solution applied to the central portion of the circuit board 101 may be greater than that of the molding solution applied to the branch portions. In addition, substantially the same amount of the molding solution may be applied to the branch portions. Meanwhile, end portions of each of the branches are spaced apart from the corners of the circuit board 101. When the end portions of the branches are too close to the corners, the molding solution may be accumulated on the corners in a subsequent process, which may increase the thickness of the first molding layer 103*a* at the corners of the circuit board 101. A second molding layer 103*b*, which will be described later, may also be formed by applying a molding solution as shown in FIG. 8 in substantially the same manner as the first molding layer 103*a*. Although the molding solution has been described as being applied differently depending on a location on the circuit board 101, a pattern for applying the molding solution to form the first molding layer 103*a* and the second molding layer 103*b* is not limited to the illustrated exemplary embodiment. For example, in some exemplary embodiments, the molding solution may be applied in various shapes, such as a "ᄅ" pattern, a zigzag pattern, and others.

Referring back to FIG. 7C, the plate 110 may be disposed on the first molding layer 103*a* and be pressed to apply pressure to the first molding layer 103*a*. The plate 110 is not particularly limited to, and may be, for example, a glass substrate, a quartz substrate, or an acrylic substrate.

A shape of the first molding layer 103*a* may be deformed by the plate 110. The plate 110 may descend to a predetermined height, and the first molding layer 103*a* may be deformed to a predetermined thickness. As the pressure is applied to the first molding layer 103*a* using the plate 110, the first molding layer 103*a* disposed in the central portion spreads to a peripheral region of the circuit board 101.

A lower surface of the plate 110 may be a flat surface, and thus, an upper surface of the first molding layer 103*a* may be deformed to be flat as the lower surface of the plate 110. In particular, the upper surface of the first molding layer 103*a* may have a flat surface regardless of an upper surface profile of the circuit board 101. In another exemplary embodiment, the plate 110 may have a nano-pattern or micro-pattern irregularities on its lower surface, and thus, an upper surface of the first molding layer 103*a* may be deformed to have the shape of the irregularities of the lower surface of the plate 110.

Figure 7C:
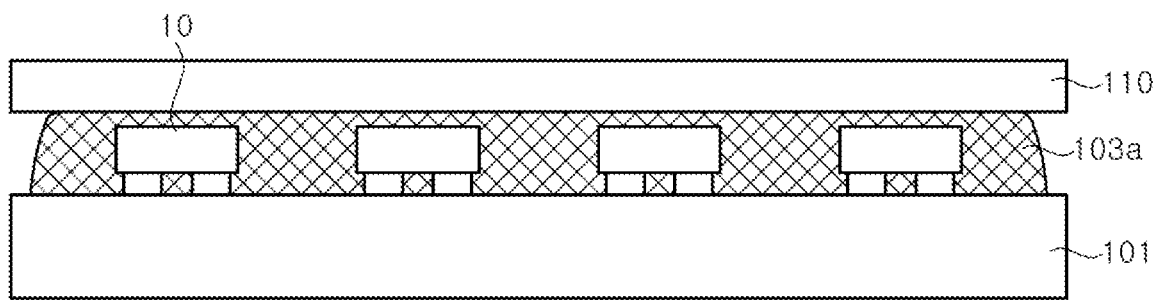
Figure 7D:
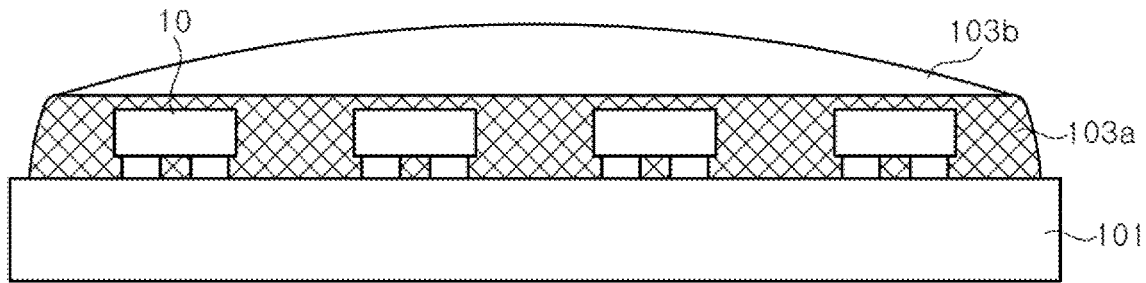

Referring to FIG. 7D, the second molding layer 103*b* may be formed by applying a molding solution on the first molding layer 103*a*. The molding solution may be applied, coated, or jetted on the first molding layer 103*a* having a flat upper surface, but the inventive concepts are not limited thereto. After the molding solution is applied, the molding solution may be pre-cured. In an exemplary embodiment, the second molding layer 103*b* may be formed of a transparent molding solution. In another exemplary embodiment, when the first molding layer 103*a* is a transparent molding layer, the second molding layer 103*b* may be formed as a black molding solution.

A larger amount of the molding solution may be applied to a central portion of the first molding layer 103*a* to form the central portion in an upward convex shape. Referring to FIG. 8, the second molding layer 103*b* may be formed by applying a molding solution on the first molding layer 103*a* similarly as in forming the first molding layer 103*a*.

Figure 7E:
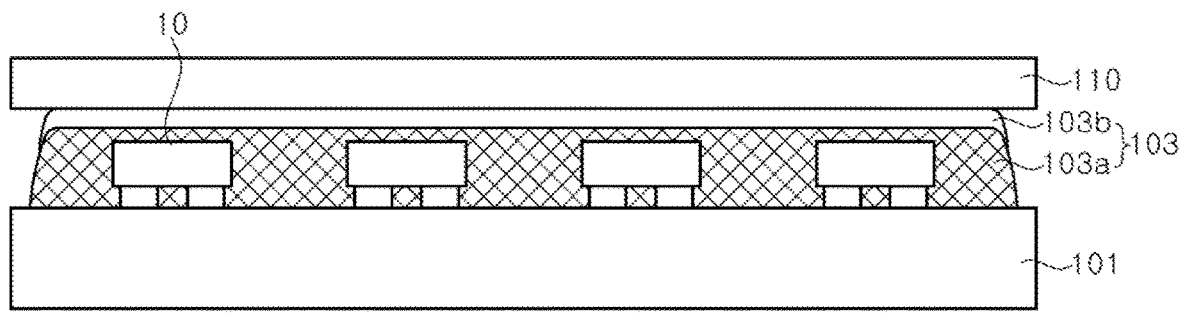

Referring to FIG. 7E, a plate 110 may be disposed on the second molding layer 103*b* and be pressed to apply a pressure to the second molding layer 103*b*. The plate 110 is not particularly limited to, and may be, for example, a glass substrate, a quartz substrate, or an acrylic substrate. In addition, the plate 110 may be the same as the plate 110 used to form the first molding layer 103*a*, but the inventive concepts are not limited thereto.

An upper surface of the second molding layer 103*b* may be deformed by the plate 110. The plate 110 may descend to a predetermined height, and the second molding layer 103*b* may be deformed to a predetermined thickness. A lower surface of the plate 110 may be a flat surface, and an upper surface of the second molding layer 103*b* may be deformed to have a flat upper surface. In another exemplary embodiment, the plate 110 may have a nano-pattern or a micro-pattern on a lower surface, and the upper surface of the second molding layer 103*b* may be deformed to have the shape of the irregularities of the plate 110.

Subsequently, the first molding layer 103*a* and the second molding layer 103*b* may be cured together by irradiating ultraviolet light, and thus, a cured molding member 103 may be formed. Ultraviolet light may be irradiated through the plate 110.

Figure 7F:
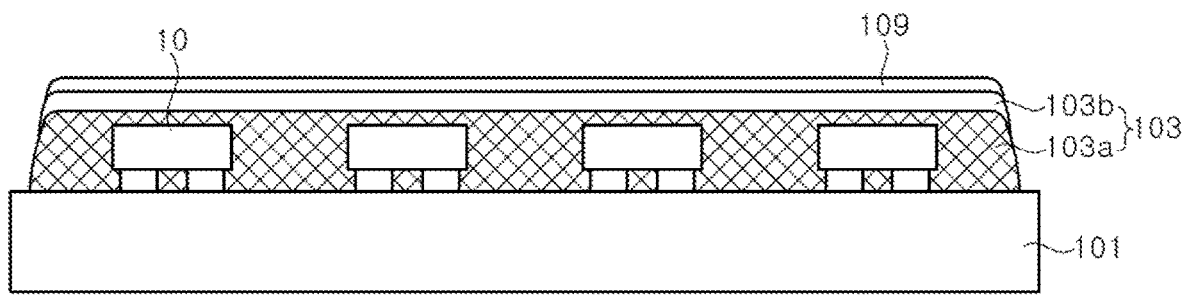

Referring to FIG. 7F, the plate 110 may be removed and an anti-glare layer 109 may be formed on an exposed surface of the molding member 103. The anti-glare layer 109 may be coated on the molding member 103 using a spray coating technique, for example. The anti-glare layer 109 may be cured using ultraviolet light.

Figure 7G:
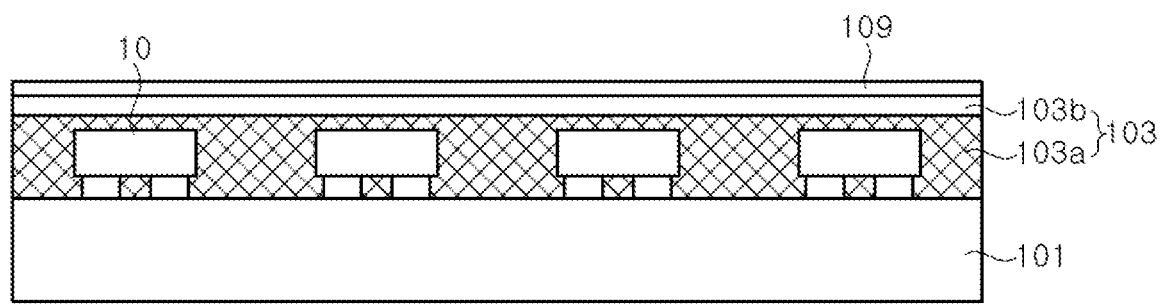

Referring to FIG. 7G, the light emitting module may be formed by cutting and removing an edge of the circuit board 101. The circuit board 101, the molding member 103, and the anti-glare layer 109 may be cut together using techniques such as dicing, laser cutting, and routing. The circuit board 101, the molding member 103, and the anti-glare layer 109 may have side surfaces flush with one another by cutting.

FIGS. 9A through 9H are schematic cross-sectional views illustrating a method of manufacturing a light emitting module according to another exemplary embodiment. Hereinafter, repeated descriptions of the manufacturing process substantially the same as those described in FIGS. 7A through 7G will be omitted.

Figure 9A:
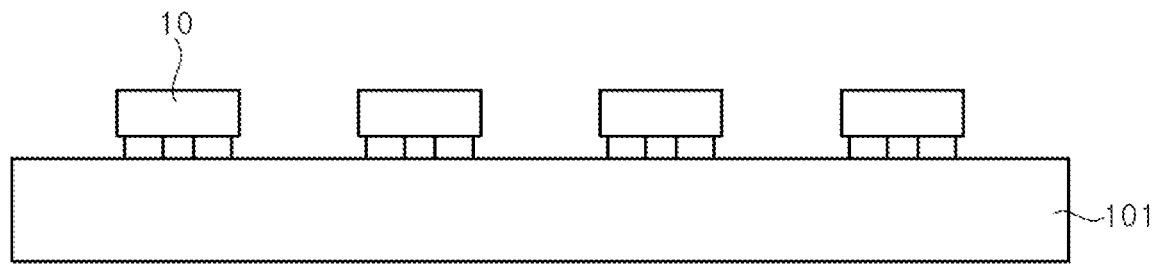
FIGS. 9A, 9B, 9C, 9D, 9E, 9F, 9G, and 9H are schematic cross-sectional views illustrating a method of manufacturing a light emitting module according to another exemplary embodiment.
Figure 9B:
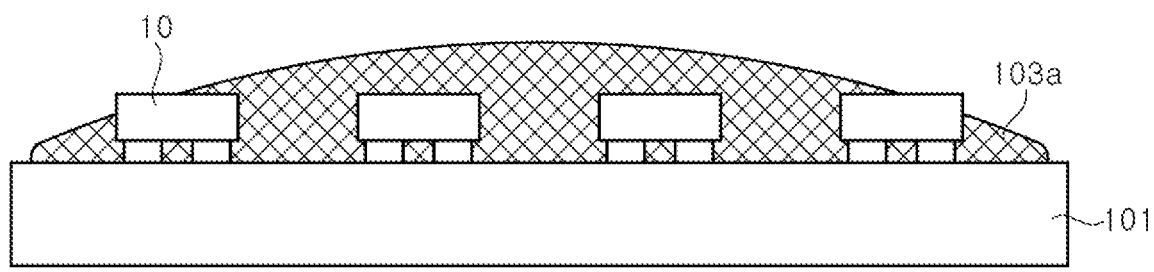
Figure 9C:
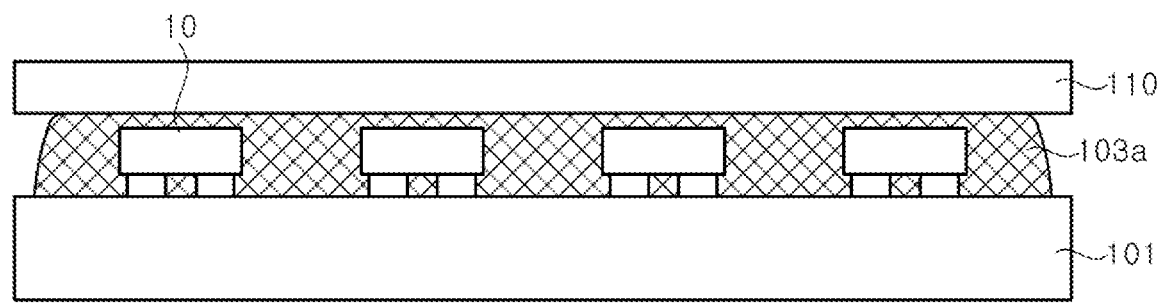
Figure 9D:
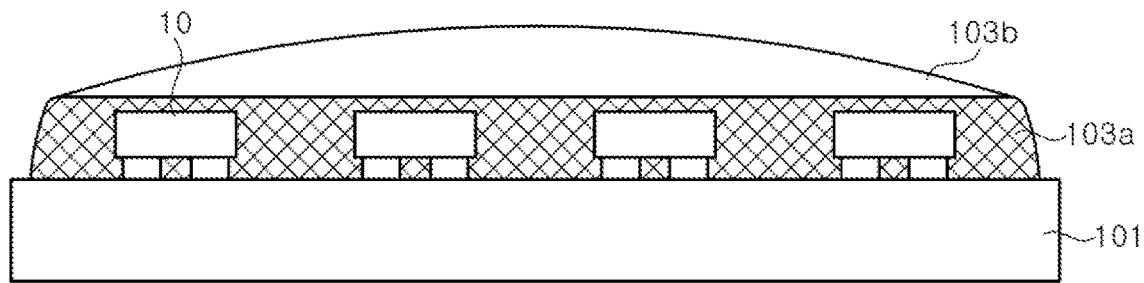
Figure 9E:
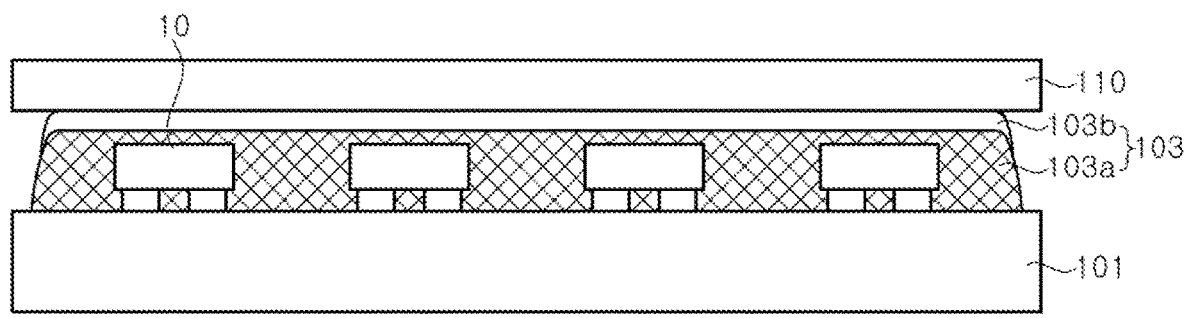

Referring to FIG. 9A, a plurality of unit pixels 10 is bonded on a circuit board 101. Since a method of forming the unit pixels 10 on the circuit board 101 is substantially the same as that described in FIG. 7A, repeated descriptions thereof will be omitted.

Referring FIGS. 9B through 9E, a first molding layer 103a covering the plurality of unit pixels 10 may be formed on the circuit board 101, and a second molding layer 103b may be formed on the first molding layer 103a. Since the first molding layer 103a and the second molding layer 103b, and a method of forming the same, are substantially the same as those described in FIGS. 7B through 7E, repeated descriptions thereof will be omitted.

Figure 9F:
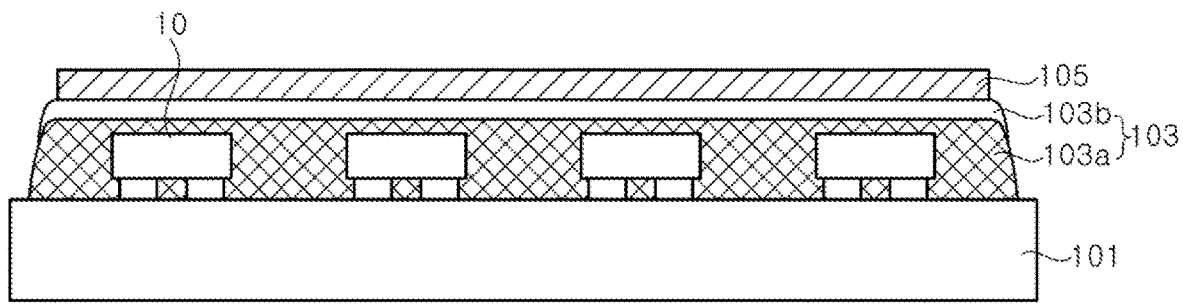

Referring to FIG. 9F, an anti-reflection layer 105 may be formed on the second molding layer 103b. An optically clear resin (OCR) may be disposed for adhesion of the anti-reflection layer 105 between the second molding layer 103b and the anti-reflection layer 105. The anti-reflection layer 105 may be in a form of an anti-reflector (AR) coating film. The anti-reflection layer 105 may be formed on the second molding layer 103b through a deposition process, for example.

Figure 9G:
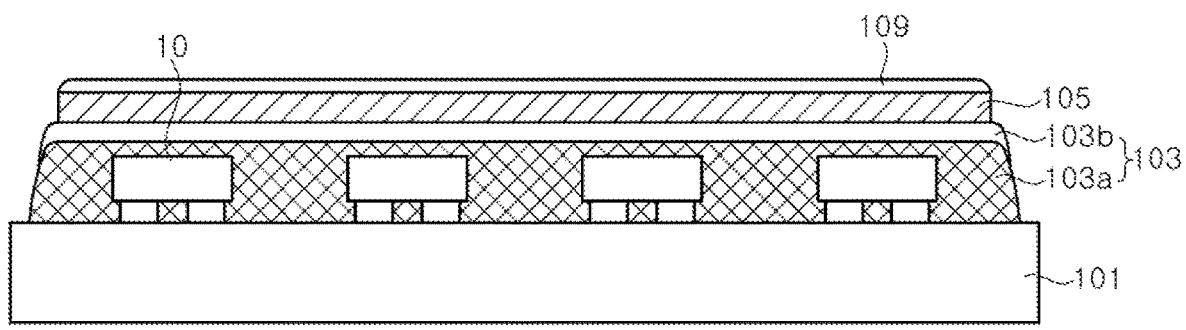

Referring to FIG. 9G, an anti-glare layer 109 may be disposed on the anti-reflection layer 105 so as to prevent glaring by scattering light. Since the anti-glare layer 109 is substantially the same as that described in FIG. 7F, repeated descriptions thereof will be omitted.

Figure 9H:
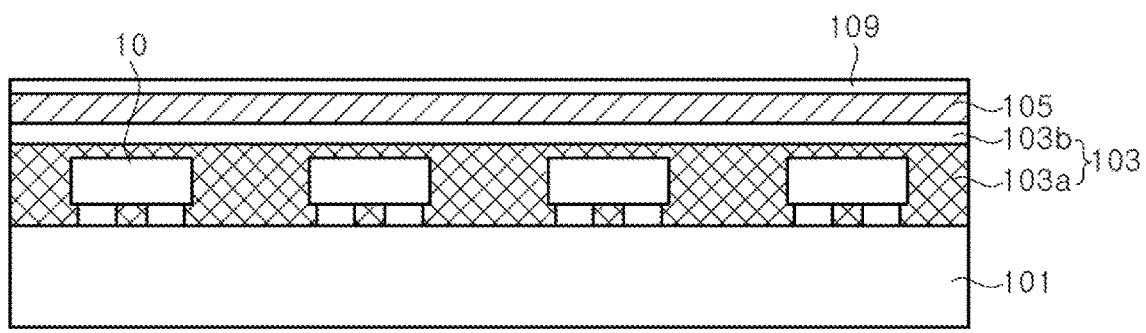

Referring to FIG. 9H, the light emitting module may be formed by cutting and removing an edge of the circuit board 101. The circuit board 101, a molding member 103, the anti-reflection layer 105, and the anti-glare layer 109 may be cut using techniques such as dicing, laser cutting, and routing. Side surfaces of the circuit board 101, the molding member 103, the anti-reflection layer 105, and the anti-glare layer 109 that have been cut may be located on a same plane.

FIGS. 10A through 10H are schematic cross-sectional views illustrating a method of manufacturing a light emitting module according to another exemplary embodiment. Hereinafter, repeated descriptions of the manufacturing process substantially the same as that described in FIGS. 7A through 7G will be omitted.

Figure 10A:
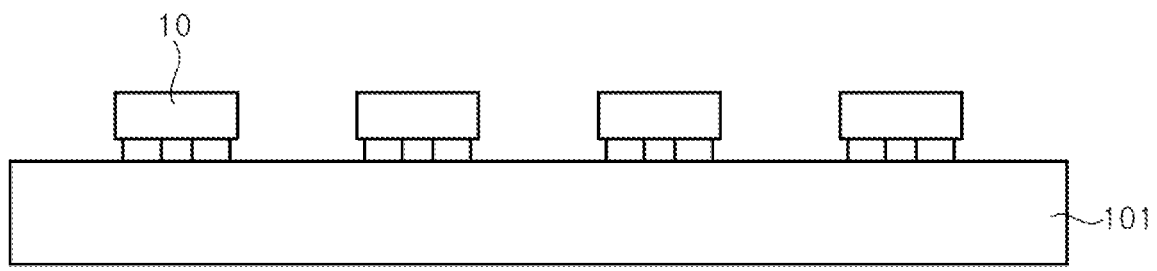
FIGS. 10A, 10B, 10C, 10D, 10E, 10F, 10G, and 10H are schematic cross-sectional views illustrating a method of manufacturing a light emitting module according to another exemplary embodiment.
Figure 10B:
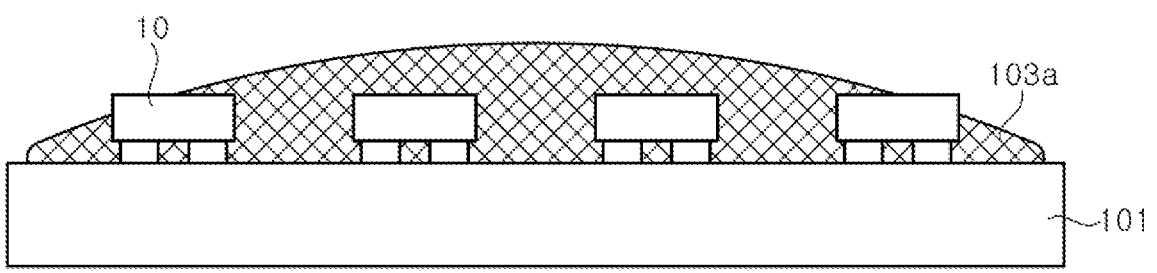
Figure 10C:
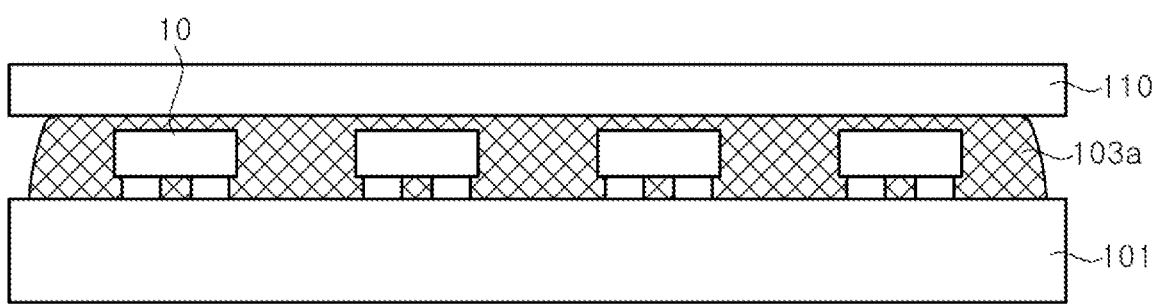
Figure 10D:
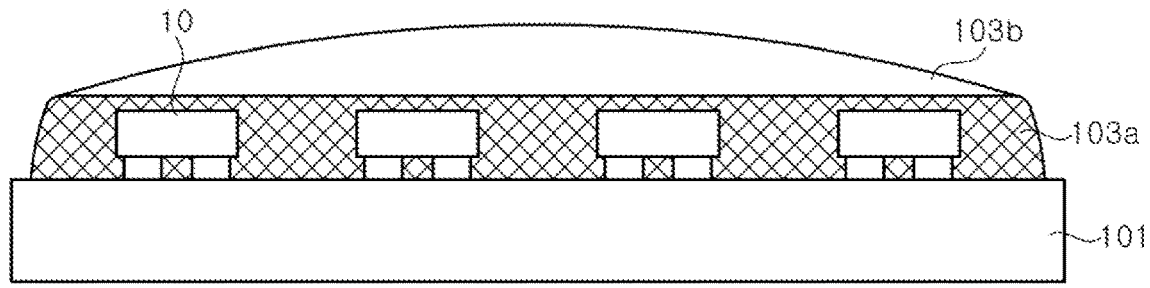

Referring to FIG. 10A, a plurality of unit pixels 10 is bonded on a circuit board 101. Since a method of forming the unit pixels 10 on the circuit board 101 is substantially the same as that described in FIG. 7A, repeated descriptions thereof will be omitted.

Referring to FIGS. 10B through 10E, a first molding layer 103a covering the plurality of unit pixels 10 may be formed on the circuit board 101, and a second molding layer 103b may be formed on the first molding layer 103a. Since the first molding layer 103a and the second molding layer 103b, and a method of forming the same, are substantially the same as those described in FIGS. 7B through 7E, repeated descriptions thereof will be omitted.

Figure 10E:
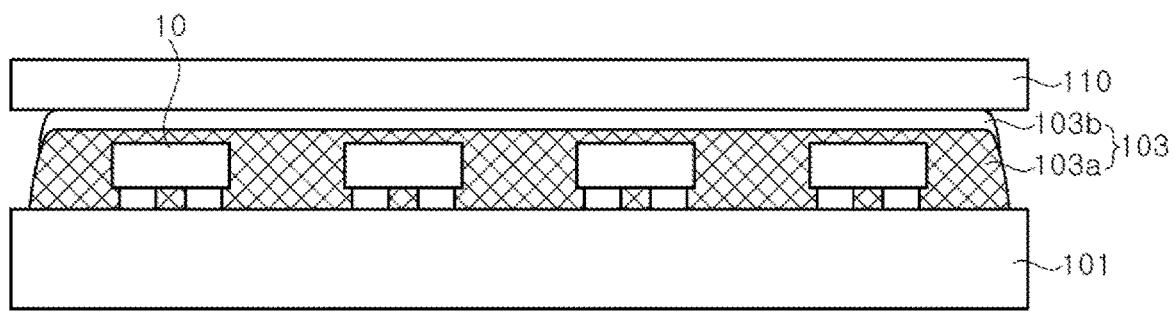
Figure 10F:
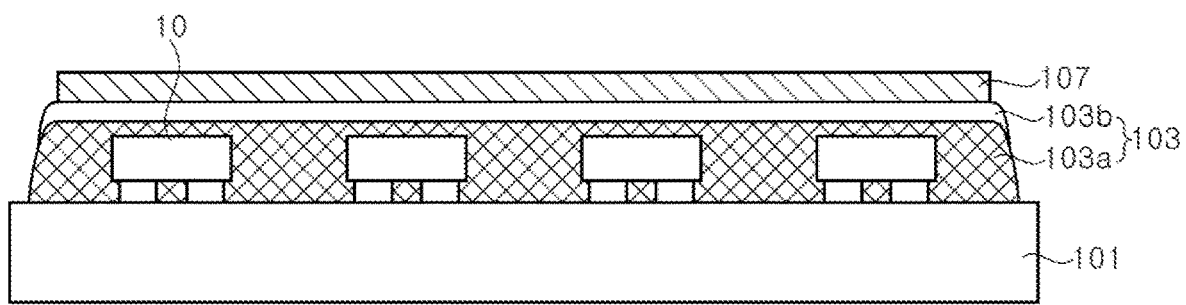

Referring to FIG. 10F, a hardness enhancement layer 107 may be disposed on the second molding layer 103b. An optically clear resin (OCR) may be disposed for adhesion of the hardness enhancement layer 107 between the second molding layer 103b and the hardness enhancement layer 107.

In another exemplary embodiment, the hardness enhancement layer 107 may function as a plate 110 shown in FIG. 10E. More particularly, the hardness enhancement layer 107 may be disposed on the second molding layer 103b, and pressure may be applied to the hardness enhancement layer 107. Accordingly, a shape of the second molding layer 103b may be deformed. Thereafter, the first molding layer 103a and the second molding layer 103b may be cured by irradiating ultraviolet rays. In this case, a process of applying pressure to the second molding layer 103b using the plate 110 of FIG. 10E may be omitted.

Figure 10G:
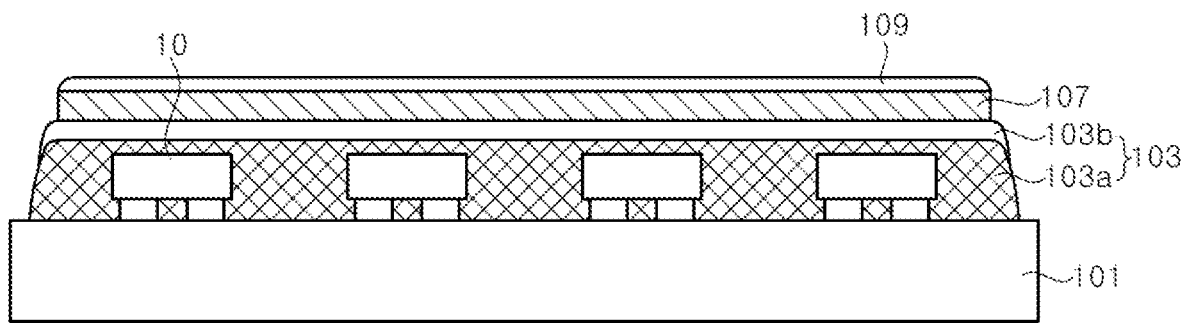

Referring to FIG. 10G, an anti-glare layer 109 may be formed on the hardness enhancement layer 107. The anti-glare layer 109 scatters light to prevent glaring. Since the anti-glare layer 109 is substantially the same as that described with reference to FIG. 7F, repeated descriptions thereof will be omitted.

Figure 10H:
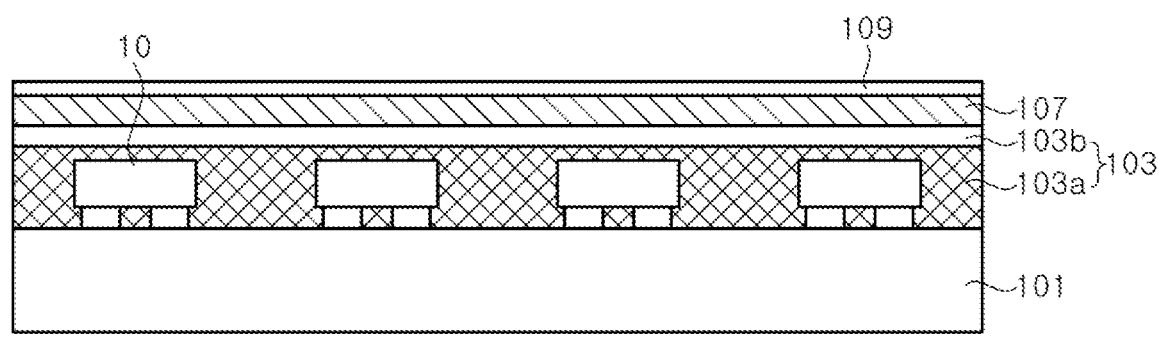

Referring to FIG. 10H, the light emitting module may be formed by cutting and removing an edge of the circuit board 101. The circuit board 101, the molding member 103, the hardness enhancement layer 107, and the anti-glare layer 109 may be cut by using techniques such as dicing, laser cutting, and routing. As such, the circuit board 101, the molding member 103, the hardness enhancement layer 107, and the anti-glare layer 109 may have side surfaces flush with one another.

Figure 11:
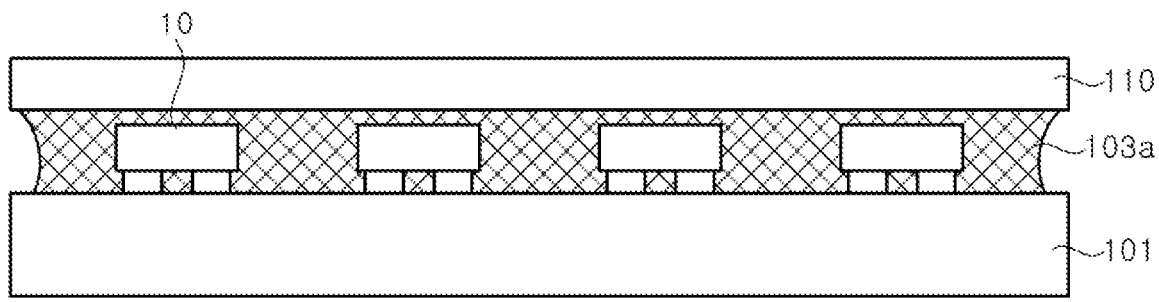
FIG. 11 is a schematic cross-sectional view illustrating a shape of a side of a molding member that may be generated in a manufacturing process of a light emitting module.

FIG. 11 is a schematic cross-sectional view illustrating a shape of a side of the molding member that may be generated in the manufacturing process of the light emitting module.

In the above-described exemplary embodiments, when pressure is applied to the first molding layer 103a using the plate 110, the shape of the upper surface of the first molding layer 103a has been described as illustrated as being deformed, as shown in FIG. 7C. The first molding layer 103a may spread from the central portion of the circuit board 101 to the peripheral region by the pressure of the plate 110, and in this case, a shape of a side of the first molding layer 103a may also be deformed. Depending on a material of the first molding layer 103a, the side surface of the first molding layer 103a may have an outwardly convex shape as shown in FIG. 7C, or may have an outwardly concave shape, as shown in FIG. 11. In addition, due to an influence of surface tension on the circuit board 101 and the plate 110, the first molding layer 103a may have a difference in a degree of spreading from the surfaces of the circuit board 101 and the plate 110 to the outside. As such, the side surface of the first molding layer 103a may have various shapes. A side surface of the second molding layer 103b may also be deformed into various shapes by the plate 110. In illustrated exemplary embodiment, since the side surfaces of the first and second molding layers 103a and 103b are cut, the side surfaces of the first and second molding layers 103a and 103b may be disposed on a same plane regardless of the shape their sides during manufacture of the first and second molding layers 103a and 103b.

FIGS. 12A through 12E are schematic cross-sectional views illustrating a method of manufacturing a light emitting module according to another exemplary embodiment.

Figure 12A:
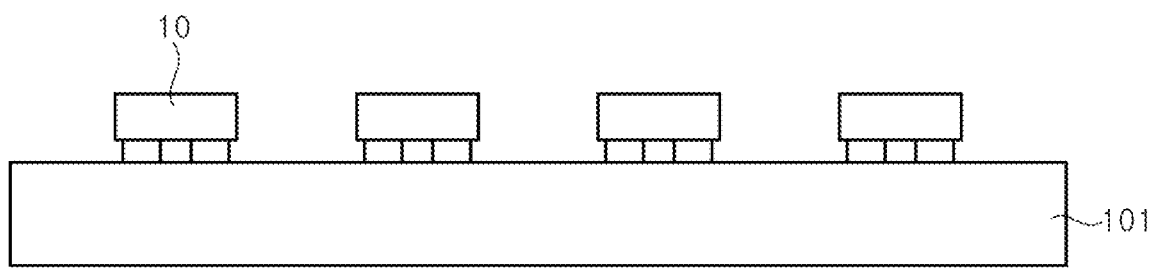
FIGS. 12A, 12B, 12C, 12D, and 12E are schematic cross-sectional views illustrating a method of manufacturing a light emitting module according to another exemplary embodiment.

Referring to FIG. 12A, a plurality of unit pixels 10 is arranged on a circuit board 101. Since a method of forming the unit pixels 10 on the circuit board 101 is substantially the same as that described with reference to FIG. 7A, repeated descriptions thereof will be omitted.

Figure 12B:
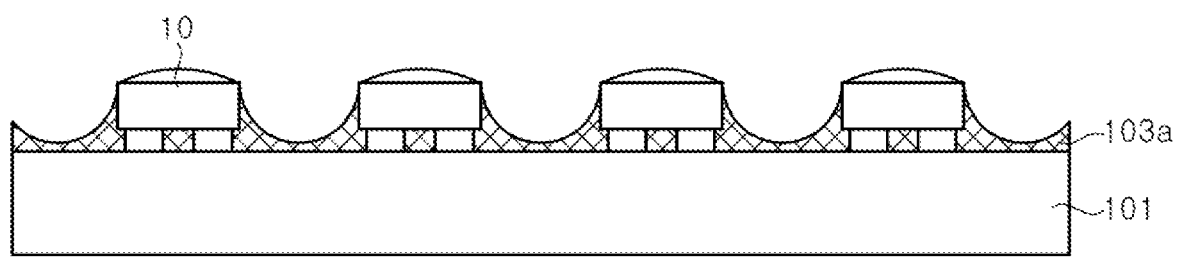

Referring to FIG. 12B, a first molding layer 103a is formed on the circuit board 101 on which the unit pixels 10 are arranged. The first molding layer 103a may be formed by spraying a molding solution using an inkjet technique. Accordingly, the first molding layer 103a is formed on upper surfaces of the unit pixels 10 and on an upper surface of the circuit board 101. In particular, the first molding layer 103a may cover side surfaces of the unit pixels 10. Since the first molding layer 103a is formed using the inkjet technique, the first molding layer 103a may be formed along the upper surface of the circuit board 101. Accordingly, even when a curvature is formed on the upper surface of the circuit board 101, the first molding layer 103a may have a shape that conforms to the shape of the circuit board 101.

Figure 12C:
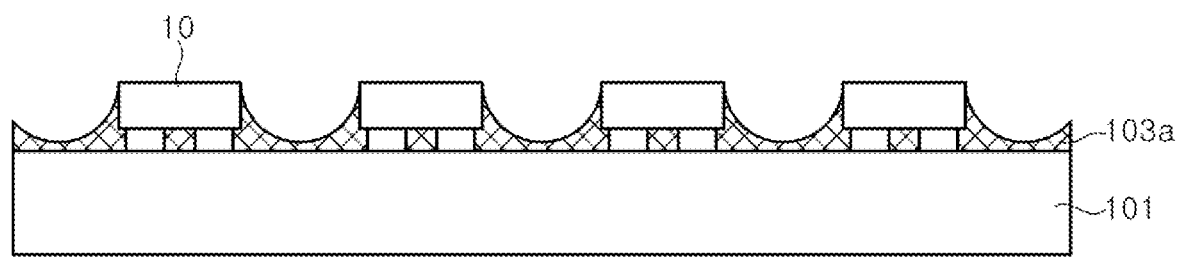

Referring to FIG. 12C, the first molding layer 103a formed on the unit pixels 10 may be removed. For example, the first molding layer 103a disposed on the unit pixels 10 may be removed using a grinding technique or the like.

Figure 12D:
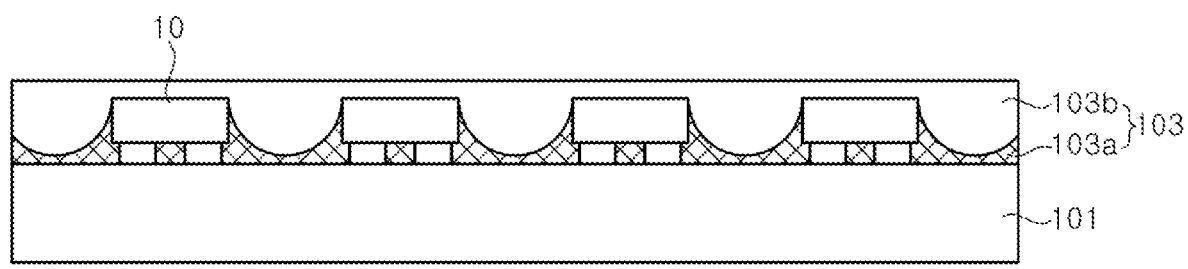

Referring to FIG. 12D, subsequently, a second molding layer 103b is formed. The second molding layer 103b may be formed using an inkjet technique. By spraying a relatively large amount of a molding solution, the second molding layer 103b may be formed to have a relatively flat upper surface. Thereafter, a molding member 103 may be formed by curing the second molding layer 103b. Since the second molding layer 103b is formed using the inkjet technique, an upper profile of the second molding layer 103b may be substantially the same as that of the circuit board 101.

Figure 12E:
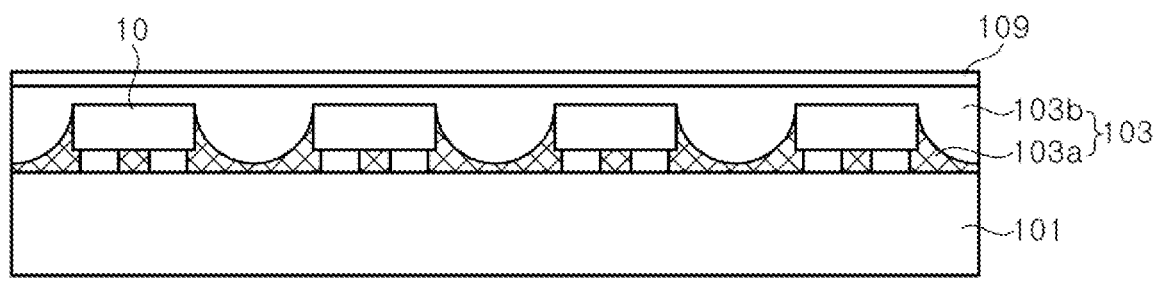

Referring to FIG. 12E, an anti-glare layer 109 may be formed on the molding member 103. Since the anti-glare layer 109 is substantially the same as that described with reference to FIG. 7F, repeated descriptions thereof will be omitted to avoid redundancy. Subsequently, the light emitting module may be formed by cutting the anti-glare layer 109, the molding member 103, and the circuit board 101.

In the illustrated exemplary embodiment, although the first molding layer 103a formed on the unit pixels 10 is described as being removed, in some exemplary embodiments, the first molding layer 103a formed on the unit pixels 10 may be retained. Furthermore, a curvature of the first molding layer 103a may be alleviated by forming the first molding layer 103a with a sufficient amount by using the inkjet technique, and thus, the light emitting module as described in FIG. 3B may be manufactured.

According to exemplary embodiments, a light emitting module may reduce a color tone change and minimize or at least suppress loss of luminance by disposing a molding member including a black molding layer and a transparent molding layer on a circuit board so as to cover a plurality of unit pixels.

In addition, according to exemplary embodiments, a light emitting module may have an improved surface hardness by disposing a hardness enhancement layer on the molding member covering the plurality of unit pixels.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting module, comprising:
a circuit board;
a plurality of unit pixels arranged on the circuit board;
a molding layer covering the unit pixels; and
an anti-glare layer disposed on the molding layer,
wherein the molding layer includes a first molding layer at least partially covering each of the unit pixels, and a second molding layer covering the first molding layer, and
wherein the first molding layer located on a side surface of at least one of the plurality of unit pixels forms a sidewall including a region that increases in thickness along the side surface from an upper portion toward a lower portion of the at least one of the plurality of unit pixels.

2. The light emitting module of claim 1, wherein:
the first molding layer includes a black molding layer; and
the second molding layer includes a transparent molding layer.

3. The light emitting module of claim 2, wherein:
the first molding layer covers a side surface and an upper surface of each of the unit pixels; and
the second molding layer is disposed over the first molding layer.

4. The light emitting module of claim 2, wherein:
the first molding layer at least partially covers a side surface of the unit pixel,
the second molding layer covers the first molding layer, and
the first molding layer has a concave shape in a region between the unit pixels.

5. The light emitting module of claim 4, wherein a region of the second molding layer is disposed between the unit pixels.

6. The light emitting module of claim 4, wherein:
the first molding layer covers upper surfaces of the unit pixels, and
the first molding layer located on the unit pixels has a convex shape.

7. The light emitting module of claim 1, wherein an upper surface profile of the second molding layer is substantially the same as a surface profile of the circuit board.

8. The light emitting module of claim 1, wherein:
an upper surface of the circuit board is non-planar; and
each of the first molding layer and the second molding layer has a flat upper surface.

9. The light emitting module of claim 1, further comprising an anti-reflection layer disposed between the molding layer and the anti-glare layer.

10. The light emitting module of claim 1, further comprising a hardness enhancement layer disposed between the molding layer and the anti-glare layer.

11. A display apparatus, comprising:
a panel substrate; and
a plurality of light emitting modules arranged on the panel substrate, each of the light emitting modules comprising:
a circuit board;
a plurality of unit pixels arranged on the circuit board;
a molding layer covering the unit pixels; and
an anti-glare layer disposed on the molding layer,
wherein the molding layer includes a first molding layer at least partially covering each of the unit pixels, and a second molding layer covering the first molding layer, and
wherein the first molding layer located on a side surface of at least one of the plurality of unit pixels forms a sidewall including a region that increases in thickness along the side surface from an upper portion toward a lower portion of the at least one of the plurality of unit pixels.

\* \* \* \* \*